Aug. 22, 1961 M. S. GLASS 2,997,625

MAGNETRONS

Filed Nov. 25, 1953 2 Sheets-Sheet 1

INVENTOR
M. S. GLASS
BY Jerome J. Falk
ATTORNEY

Aug. 22, 1961 M. S. GLASS 2,997,625

MAGNETRONS

Filed Nov. 25, 1953 2 Sheets-Sheet 2

INVENTOR
M. S. GLASS
BY [signature]
ATTORNEY

United States Patent Office 2,997,625

Patented Aug. 22, 1961

2,997,625
MAGNETRONS

Myron S. Glass, West Orange, N.J., assignor to Bell Telephone Laboratories, Incorporated, New York, N.Y., a corporation of New York Filed Nov. 25, 1953, Ser. No. 394,371
7 Claims. (Cl. 315—39.69)

This invention relates to electron discharge devices of the magnetron type and more particularly to such devices which are tunable by the insertion of tuning pins into the individual cavity resonators.

One known method of tuning magnetrons over a given frequency band is by inserting tuning pins into the individual cavity resonators of the anode structure. Examples of magnetrons of this type are disclosed in Patent 2,459,030, issued January 11, 1949, to H. C. Jonas et al. and in Patent 2,657,334, issued October 22, 1953, to J. W. West. To attain a wide band of frequencies over which the magnetron is tunable, the individual tuning pins are quite long; the length of the tuning pins and therefore the depth of their insertion into the anode resonators are directly related to the width of the frequency bands. However, the tuning pin assembly is supported only at one end so that an aligning problem arises which becomes more aggravated as the length of the pins is increased.

The difficulties engendered by a misalignment of the tuning pin and the cavity resonator axis result from the pin either contacting the anode or being so closely adjacent to be effectively short circuited thereto at the high frequency of operation of the tube. Obviously by the geometry of the configuration the greater the length of the tuning pin the less the alignment error that can be tolerated. It is therefore desirable to increase the tuning sensitivity of the tuning pins so that a shorter motion of the pins into the anode resonators will attain the same frequency band of tuning. Priorly it has been known that tuning sensitivity could be improved by increasing the diameter of the tuning pins used in the inductive tuning to effect a larger change in inductance for each incremental distance of insertion of the pin into the anode resonator. However, it is apparent that this method of increasing tuning sensitivity is inapplicable as it aggravates the problem of small clearances between tuning pins and the resonator bores and increases the probability of shorting contacts between the pins and the anode.

It is an object of this invention to improve the tuning sensitivity of inductively tuned cavity resonator circuits and magnetrons and to prevent shorting contacts between the tuning pins and the resonator bores.

It is another object of this invention to increase the tuning sensitivity of inductively tuned cavity resonator circuits and magnetrons so that the same frequency band may be encompassed by shorter or thinner tuning pins or an increased frequency band may be encompassed by the same size tuning pins.

It is a further object of this invention to increase the tuning sensitivity of inductively tuned cavity resonator circuits without increasing the capacitance of the circuit and thus without depressing the frequency of oscillation of the circuit or weakening the mode separation.

These and other objects of this invention are attained in one specific illustrative embodiment wherein the tuning sensitivity is increased by providing that the slot extending from the central aperture of the anode structure, wherein the cathode is located, to the cavity resonator bore is of two widths and specifically the portion from the resonator bore to approximately the center line of the strap system is much narrower than the portion of the slot from this center line to the central aperture. By modifying the anode slot in accordance with this invention the tuning sensitivity is improved, thereby allowing a shortening of the tuning stroke or a decrease in pin diameter and an alleviation of the mechanical clearance problems priorly encountered in inductive tuning of magnetrons.

It is a feature of this invention that a portion of the slot adjacent the resonator bore be of a smaller dimension than the remainder of the slot extending to the central cavity of the anode structure whereby the effect of the change of inductance due to the variance of the position of a tuning pin in the resonator bore is increased.

Further it is a feature of this invention that the slot have portions of different widths, the overall slot being narrow adjacent the resonator bore and wider adjacent the central cavity of the anode structure.

A complete understanding of this invention and of these and various other features thereof may be gained from consideration of the following detailed description and the accompanying drawing, in which.

Figure 1:
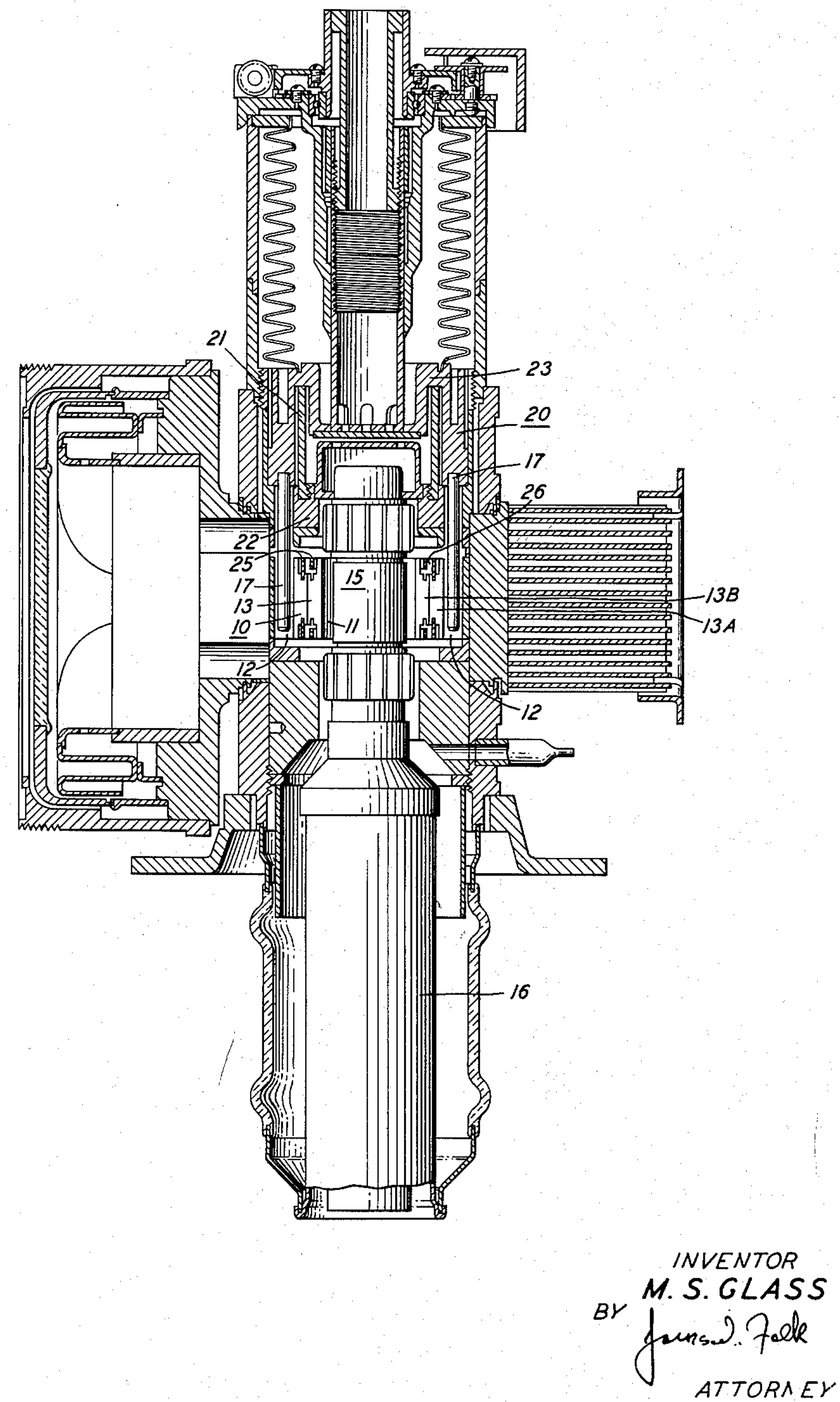
FIG. 1 is a sectional view of a magnetron in which this invention may be incorporated.

Turning now to the drawing, the magnetron therein illustrated is of the type fully described in Patent 2,657,334 issued October 27, 1953, to J. W. West and comprises an anode 10 having an axial bore or central cavity 11 and a plurality, such as sixteen, of cavity resonator bores 12 spaced in a circular array around the axial bore 11 and communicating therewith by means of slots 13 further described below. A cathode 15 comprising a cylindrical sleeve having an electron emissive coating thereon is positioned within the central cavity 11 and supported by a supporting cylinder 16. Tuning pins 17 extend into each of the cavity resonator bores 12 and are axially insertable therein by a tuning mechanism 20. A cylindrical tuning head choke 21 is mounted by the pole piece 22 and cooperates with the tuning pin carrier 23 to prevent power loss into the tuning head cavities, as more fully described in the above mentioned West patent.

The cavity resonator bores 12 may be all of the same size or may be of different diameters and similarly the tuning pins 17 may be all of the same size or may be of different diameters to prevent moding over the tuning range of frequencies or to cancel reactive disturbances that may be introduced into the system, as by the ouptut circuit, in accordance with the disclosures of applications Serial No. 348,526 of M. S. Glass and L. R. Walker, now U.S. Patent No. 2,829,306, granted April 1, 1958; 348,438 of R. C. Fletcher and S. Millman, now U.S. Patent No. 2,797,362, granted June 25, 1957; 348,365 of M. S. Glass now U.S. Patent No. 2,797,361, granted June 25, 1957; and 348,218 of J. P. Molnar now U.S. Patent No. 2,824,998, granted February 25, 1958; all filed April 13, 1953.

Figure 2A:
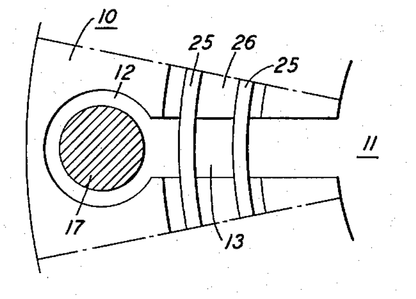
FIG. 2A is a plan view of a segment of an anode showing an anode slot in accordance with the prior art.
Figure 2B:
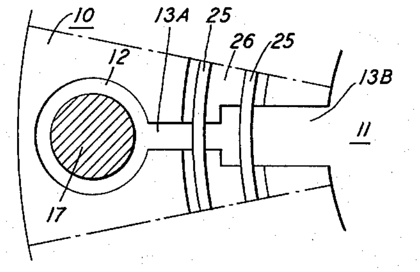
FIG. 2B is a plan view of a segment of an anode showing an anode slot in accordance with one specific illustrative embodiment of this invention.

Turning now to FIG. 2 there is depicted a segment of the anode 10 in which segment is located a single resonator bore 12 and the slot 13 extending between it and the central cavity or axial bore 11. As can clearly be seen in FIG. 2 a strapping system, including straps 25, may be employed as is known in the art, the anode having a circular groove 26 at each end in which the straps are located and the straps being electrically connected to alternate anode segments. FIG. 2A depicts the prior art configuration, as disclosed in the above referred to applications, and FIG. 2B a configuration in accordance with this invention. As can clearly be seen in FIG. 2B the slot 13 is in two sections, there identified as 13A and 13B. The portion of the slot 13A adjacent the resonator bore 12 is of a narrower width than the remaining portion 13B of the slot. In one specific illustrative embodiment wherein the resonator bores 12 were of 0.250 inch diameter, the portion 13B was 0.125 inch in width and the portion 13A was 0.055 inch in width.

Figure 3:
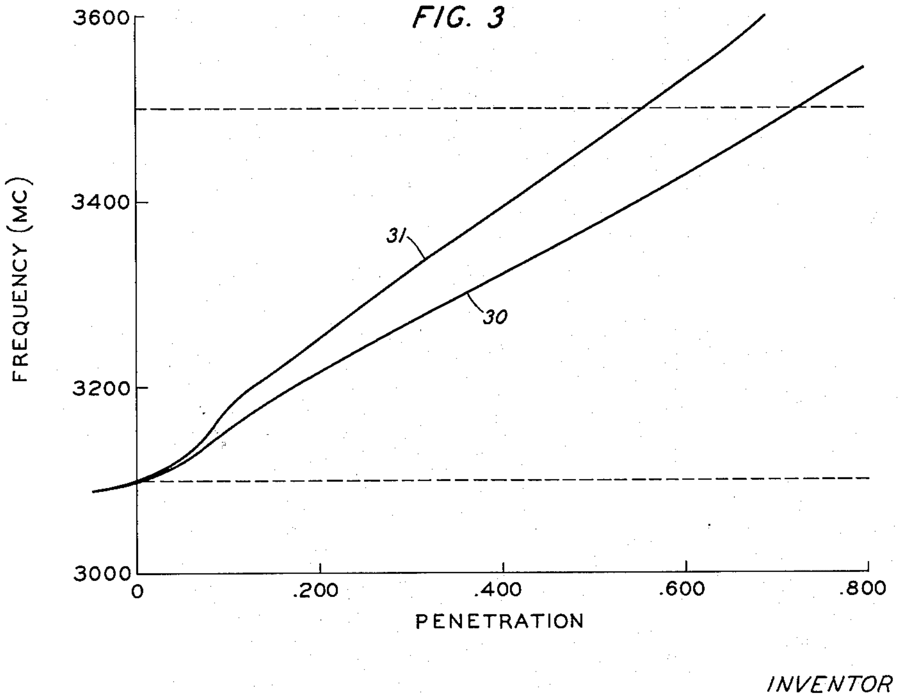
FIG. 3 is a graph of frequency plotted against tuning pin penetration into the cavity resonators for magnetrons of the prior art configuration of FIG. 2A and having anode slots as depicted in FIG. 2B.

The improvement in tuning sensitivity by employing anodes in accordance with this invention can be readily seen in FIG. 3 wherein depth of insertion or penetration of the tuning pins 17 is plotted against the operating frequency of the magnetron. Curve 30 is the plot for the prior art design and curve 31 for a magnetron having anode resonator slots in accordance with this invention. The desired tuning range is from 3,100 megacycles to 3,500 megacycles, which limits are indicated by the broken lines in the figure. Both curves 30 and 31 therefore start at the lower frequency limit of 3,100 megacycles with no penetration of the tuning pins in the resonator bores, and the curves are basically similar in shape. However, to attain 3,500 megacycles, a penetration of 0.725 inch was required with an anode in accordance with the prior art whereas a penetration of only 0.565 inch was required with an anode in accordance with this invention, as depicted in FIG. 2B. Thus with the anode-resonator system modified in accordance with this invention approximately 22 percent less pin penetration is required to cover the same tuning band due to the increased tuning sensitivity attained by this invention.

This increased tuning sensitivity may be utilized to decrease the required motion of the tuning pins to tune over a specified band of frequencies, to decrease the diameter of the tuning pins, with the decrease in tuning pin motion and diameter providing increased clearance between the pins and the resonator bores, or, if no clearance problem exists, to increase the tuning band for the same depth of penetration of the tuning pins. As mentioned above the problem of pin alignment is a very serious one in inductively tuned magnetrons and thus being able to reduce the depth of insertion or the tuning pin diameter to attain the same tuning range is very advantageous. The seriousness of this alignment problem can be appreciated from a consideration of the tuning pins and the support structure depicted in FIG. 1. As can there be seen there is a relatively long pin travel and relatively small clearance between the tuning pin and the anode, which clearance has been exaggerated in the drawing for purposes of clarity. Further not only are the tuning pins supported at only one end and this point of support removed from the anode, but the whole tuning structure is supported at a bearing which, in the illustrative magnetron depicted, is about two and one half inches beyond the end of the resonator.

The magnetrons on which the data for the two curves 30 and 31 were taken were identical except for the following changes in the magnetron incorporated features of this invention: (1) each of the sixteen resonator slots was of two widths, as shown in FIG. 2B and was 0.055 and 0.125 inch wide, except the slots for resonators No. 4 and 12 which were of the prior art configuration disclosed in FIGS. 2A and were 0.125 inch wide; (2) all the tuning pins were of the same diameter, 0.182 inch; and (3) the slot of the output transformer was reduced from 0.055 inch to 0.050 inch. The treatment of the No. 4 and 12 resonator slots differs from the treatment of the other fourteen resonator slots in order to cancel out the residual reactance of the output transformer; this special treatment of these two slots thus replaces the decreased diameter of the tuning pins in the No. 4 and 12 resonators of the prior art design on which the data for curve 30 was taken. The cancellation of the residual reactance by variations in tuning pin diameters in this manner is disclosed in the above-mentioned Glass application. In each magnetron the No. 2 and 10 resonator bores were 0.250 inch while the other bores were 0.236 inch for equalization of the 7-mode coupling, and thus the prevention of moding, as disclosed in the above mentioned Fletcher-Molnar application. The change in the slot width of the output transformer compensates for the change of impedance of the anode slot resulting from the resonator design in accordance with this invention.

The effect of the narrow portion of the resonator slot 13 on the tuning sensitivity can best be analyzed by considering the slot 13 as a parallel ribbon transmission line terminated at one end by an inductive load, represented by the resonator bore 12, open circuited at the other end, and having a lumped capacitance across it at one point, the capacitance being that associated with the strap 25. The impedance of the transmission line at any point along the line is then directly proportional to the width of the slot 13 at that point. At the operating frequency the transmission line is a quarter-wave long effectively short-circuited at one end and open circuited at the other end. By providing that the impedance line have a low impedance adjacent the inductive load, the change in the inductive loading will have a greater effect on the apparent electrical length of the line than the same change of inductance looking into a higher impedance line.

While considering the slot 13 as a transmission line affords the best quantitative analysis of the effect on the change in dimension of the slot on the tuning sensitivity of the magnetron, that analysis is beyond the scope of this discussion. Instead the effect of decreasing the slot width adjacent the resonator bore may be considered more simply and qualitatively by the following simplified physical explanation. At the resonator bore 12 the impedance of the system is substantially pure inductance; similarly at the central cavity 11 the impedance across the slot 13 is substantially pure capacitance. Between these two extremes there is a portion of the resonator slot 13 which is partially both. Particularly directly adjacent the cavity resonator 12 there is a fringing of the inductance into the slot 13 so that the total inductance of the system can be considered as including both the inductance of the tuning pin itself and also of this fringing in the resonator slot. By reducing the width of the slot 13 at this point the amount of this fringe inductance, which is not varied by the insertion of the tuning pin 17, is decreased. Therefore the effect of the insertion of the tuning pin on the total inductance of the system is increased and the tuning sensitivity is thus increased. As the change in capacitance of the portion 13A is about equal to the change in inductance due to the decrease in the width of the slot, the overall frequency of the system is not affected.

The above discussions represent two different ways of considering and explaining the meritorious result attained by the practice of this invention, but this invention is not dependent on these explanations nor is it to be considered as limited thereto. Instead they have been included in the application so that, after the realization of the improvement of the invention, some insight might be gained in the possible explanations therefor.

It is desirable that the slot 13 not be too narrow over its entire length for a number of reasons. For one thing, the added capacitance due to a decrease in the slot width depresses the frequency of the oscillator when it is not balanced by a decrease in inductance in the slot. Thus to make the entire slot 13 the width of the portion 13A would cause the magnetron to oscillate at a lower frequency. While this is a major reason for desiring a wide slot 13 over a portion of its length, other reasons are that narrowing the width of the slot lowers the impedance of the oscillator and also decreases the effect of the strap capacitance, thereby weakening the mode separation.

It is therefore apparent that an anode structure in accordance with this invention attains a desired balance between a low inductance slot adjacent the resonator bore and the tuning pin and a low capacitance slot adjacent the central cavity.

While the narrow portion 13A of the slot has been depicted as extending about half the length of the slot and specifically to about midway between the straps 25, it is to be understood that any length of decreased slot width adjacent the cavity resonator 12 will tend to increase the tuning sensitivity in accordance with the teaching of this invention. However there is a point at which further increasing the length of the decreased slot width portion will have substanially no effect on the inductance of the system and thus no effect on tuning sensitivity while increasing the capacitance of the system. Specifically extending the decreased slot width portion 13A beyond about the midpoint of the strap system appears to have little or no effect on increasing the tuning sensitivity.

It is to be understood that the above-described arrangements are illustrative of the application of the principles of the invention. Numerous other arrangements may be devised by those skilled in the art without departing from the spirit and scope of the invention.

What is claimed is:

1. A magnetron comprising anode means defining a plurality of resonator bores, a central aperture, and a slot extending from each of said bores to said aperture, said slots being of one width adjacent said central aperture and being of a narrower width adjacent said resonator bores, a cathode located axially within said central aperture, and tuning means insertable into each of said bores.

2. A magnetron comprising anode means defining a plurality of resonator bores, a central aperture, and a slot extending from each of said bores to said aperture, said slots having parallel sides and being of one width adjacent said central aperture and being of a narrower width adjacent said resonator bores, a cathode located in said central aperture, and a tuning pin insertable into each of said bores to vary the inductance thereof.

3. A tunable circuit comprising conductive means defining a central aperture therethrough, a plurality of bores therein located around said aperture, and a slot extending from each of said bores to said aperture, said slots being of one width adjacent said central aperture and being of a narrower width adjacent said bores, and tuning means insertable into said bores.

4. A tunable circuit comprising a conductive block having an aperture therethrough, a plurality of bores located around said aperture, and a slot connecting each of said bores with said aperture, said slots having parallel sides and being of one width adjacent said aperture and a narrower width adjacent said bores, and a tuning pin insertable into each of said bores to vary the inductance of said tunable circuit.

5. A tunable circuit comprising a conductive block having a central aperture therethrough, a plurality of bores located in a circular array around said central aperture, and a slot connecting each of said bores with said aperture, said slots having parallel sides and being of two widths, a first width adjacent said central aperture and a narrower width adjacent said bores, and a tuning pin insertable into each of said bores to vary the inductance of said tunable circuit.

6. A magnetron comprising an anode having a plurality of resonator bores located in a circular array, a central aperture within said array, and a slot connecting each of said bores with said aperture, said slots having parallel sides and being of two widths a first width adjacent said central aperture and a narrower width adjacent said bores, a cathode located in said central aperture, and a tuning pin insertable into each of said resonator bores to vary the inductance thereof.

7. A magnetron in accordance with claim 6 further comprising strap means associated with said anode and connected thereto to cross said slots between said bores and said aperture and wherein said first narrower width extends to approximately the middle of said strap means.

No references cited.